US012763731B2

(12) United States Patent
Shim et al.

(10) Patent No.: US 12,763,731 B2
(45) Date of Patent: Oct. 13, 2026

(54) PHASE-RECONFIGURABLE CIRCUITS WITH DYNAMIC PHASE MODULATION FOR WIDEBAND DUAL-INPUT POWER AMPLIFIERS

(71) Applicant: QUALCOMM Incorporated, San Diego, CA (US)

(72) Inventors: Sunbo Shim, San Diego, CA (US); Guoxiang Han, San Diego, CA (US); David Angel Calvillo Cortes, San Diego, CA (US); Paolo Enrico De Falco, San Diego, CA (US); Antonino Scuderi, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 465 days.

(21) Appl. No.: 18/471,231

(22) Filed: Sep. 20, 2023

(65) Prior Publication Data

US 2025/0096734 A1 Mar. 20, 2025

(51) Int. Cl.
*H03F 1/02* (2006.01)
*H03F 3/24* (2006.01)

(52) U.S. Cl.
CPC ........... *H03F 1/0288* (2013.01); *H03F 3/245* (2013.01); *H03F 2200/105* (2013.01); *H03F 2200/336* (2013.01); *H03F 2200/451* (2013.01)

(58) Field of Classification Search
CPC .. H03F 1/0288; H03F 3/245; H03F 2200/105; H03F 2200/336; H03F 2200/451
USPC ........................................................... 330/297
See application file for complete search history.

(56) References Cited

U.S. PATENT DOCUMENTS

| | | | | |
|---|---|---|---|---|
| 9,647,611 | B1 | 5/2017 | Embar et al. | |
| 10,784,636 | B1 * | 9/2020 | Vigilante | H04B 1/40 |
| 10,886,612 | B2 * | 1/2021 | Ngai | H01Q 3/34 |
| 11,316,489 | B2 * | 4/2022 | Patel | H03K 5/026 |
| 2007/0037544 | A1 * | 2/2007 | Heikkinen | H03F 1/3211 455/323 |
| 2013/0241640 | A1 | 9/2013 | Lin et al. | |
| 2018/0175800 | A1 | 6/2018 | Hayes et al. | |

(Continued)

FOREIGN PATENT DOCUMENTS

| | | | | |
|---|---|---|---|---|
| KR | 101097391 | B1 * | 12/2011 | H03F 3/602 |
| WO | 2022058778 | A1 | 3/2022 | |

OTHER PUBLICATIONS

Greene K., et al., "A 60-GHz Dual-Vector Doherty Beamformer", IEEE Journal of Solid-State Circuits, IEEE, USA, vol. 52, No. 5, May 1, 2017, pp. 1373-1387, XP011646416, p. 1373, left-hand column, line 25—p. 1386, left-hand column, line 2, figures 1-24.

(Continued)

*Primary Examiner* — Hafizur Rahman
(74) *Attorney, Agent, or Firm* — Gerald P. Joyce, III

(57) ABSTRACT

A phase-reconfigurable circuit for a dual-input power amplifier is provided. The circuit includes an envelope detector configured to process an envelope of an RF input signal into an envelope signal. A first vector-sum phase-shifter and a second vector-sum phase-shifter processes an in-phase and a quadrature-phase version of the RF input signal with the envelope signal to produce a first differential output signal having a dynamically-modulated phase difference with a second differential output signal.

29 Claims, 12 Drawing Sheets

(56) References Cited

U.S. PATENT DOCUMENTS

| | | | | |
|---|---|---|---|---|
| 2018/0302042 | A1 | 10/2018 | Zhang et al. | |
| 2019/0058245 | A1* | 2/2019 | Safavi Naeini | H01Q 3/267 |
| 2021/0028768 | A1* | 1/2021 | Hong | H01Q 3/36 |
| 2021/0344313 | A1* | 11/2021 | Martin | H03F 1/0266 |

OTHER PUBLICATIONS

Hirai A., et al., "Vector-Sum Phase Shifter Using a Tunable Active gm-C Polyphase Filter", IEEE Transactions on Microwave Theory and Techniques, IEEE, USA, vol. 68, No. 10, Oct. 1, 2020, pp. 4091-4102, XP011812538, p. 4091, left-hand column, line 22—p. 4101, left-hand column, line 25, figures 1-23.

International Search Report and Written Opinion—PCT/US2024/041763—ISA/EPO—Dec. 4, 2024.

Peng Y., et al., "A V-Band Digital-Control Vector-Sum Phase Shifter in 28-nm Bulk CMOS", 2022 IEEE MTT-S International Microwave Workshop Series on Advanced Materials and Processes for RF and THz Applications (IMWS-AMP), IEEE, Nov. 27, 2022, 3 Pages, XP034335123, p. 1, left-hand column, line 16—p. 3, right-hand column, line 6, figures 1-9.

Ye Y., et al., "A Full-360° Vector-Sum Phase Shifter with Low RMS Phase and Gain Errors for 60 GHz 5-bit Application", 2014 9th European Microwave Integrated Circuit Conference, European Microwave Association—EUMA, Oct. 6, 2014, pp. 305-308, XP032712548, p. 305, left-hand column, line 15—p. 308, right-hand column, line 7, figures 1-12.

* cited by examiner

PHASE-RECONFIGURABLE CIRCUITS WITH DYNAMIC PHASE MODULATION FOR WIDEBAND DUAL-INPUT POWER AMPLIFIERS

FIELD OF TECHNOLOGY

The present disclosure relates generally to wireless communications and more specifically to a phase-reconfigurable circuit with dynamic phase modulation for wideband dual-input power amplifiers.

BACKGROUND

The orthogonal frequency division modulation (OFDM) used in modern telecommunication systems such as 5G efficiently use bandwidth but at the price of a relatively high peak-to-average power ratio (PAPR). The high PAPR complicates the power amplifier design for such systems. For example, if the power amplifier is biased for good efficiency at the average power of the transmitted signal, the power amplifier may then clip or saturate during the moments of peak power so as to cause non-linearities. Conversely, if the power amplifier is biased for good efficiency at the peak power, the power amplifier is then inefficient at the average power level. A traditional power amplifier for OFDM signals would thus have to choose between good linearity but poor efficiency or high efficiency but poor linearity.

To have both high efficiency and high linearity in the same system, dual-input amplifiers such as Doherty amplifiers have been developed that include both a carrier amplifier and a peaking amplifier. Doherty amplifiers require a phase-reconfigurable circuit for splitting and phase shifting the input signal to drive the peaking and carrier amplifiers and also an output network to combine the output signals from the peaking and carrier amplifiers. In a traditional Doherty amplifier, the phase-reconfigurable circuit phase shifts the input signal to the peaking amplifier by −90° as compared to the input signal to the carrier amplifier. To enhance performance, generalized Doherty amplifiers have been developed in which the phase shift is no longer set to −90° but instead may be tuned to any suitable value.

SUMMARY

The following summary discusses some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

In accordance with an aspect of the disclosure, a dual-input amplifier with dynamic phase modulation is provided that includes: an envelope detector configured to process an envelope of an RF input signal to form an envelope signal; a single-ended-to-differential converter configured to convert a version of the RF input signal into a differential RF input signal; an I/Q generator circuit configured to convert the differential RF input signal into a differential in-phase signal and into a differential quadrature-phase signal; a first vector-sum phase-shifter; a second vector-sum phase-shifter; a first pair of output terminals; and a second pair of output terminals, wherein the first vector-sum phase-shifter and the second vector-sum phase shifter are configured to process the differential in-phase signal and the differential quadrature-phase signal to form a first differential output signal at the first pair of output terminals and to form a second differential output signal at the second pair of output terminals and to adjust a phase difference between the first differential output signal and the second differential output signal responsive to the envelope signal.

In accordance with another aspect of the disclosure, a dual-input amplifier method is provided that includes: converting an RF input signal into a differential in-phase signal and a differential quadrature-phase signal; processing the differential in-phase signal and the differential quadrature-phase signal to form a first differential output signal and a second differential output signal, wherein the first differential output signal has a phase difference with respect to the second differential output signal; and adjusting the phase difference responsive to a power of the RF input signal.

In accordance with yet another aspect of the disclosure, a dual-input amplifier is provided that includes: a pair of vector-sum phase-shifters configured to dynamically modulate a phase difference between a first differential output signal and a second differential output signal responsive to a power of an input RF signal; a first differential-to-single-ended converter configured to convert the first differential output signal into a first single-ended output signal; a first driver amplifier configured to amplify the first single-ended output signal to form a first driver output signal; and a first power amplifier configured to amplify the first driver output signal to form a first power amplifier output signal.

Finally, in accordance with another aspect of the disclosure, a transmitter is provided that includes: a delay and impedance matching circuit configured to delay an RF input signal into a delayed matched signal; a pre-amplifier configured to amplify the delayed matched signal to form an amplified input signal; a single-ended-to-differential conversion circuit configured to convert the amplified input signal into a differential input signal; a polyphase filter configured to convert the differential input signal into a differential in-phase signal and a differential quadrature-phase signal; a first vector-sum phase-shifter and a second vector-sum phase shifter both configured to process the differential in-phase signal and the differential quadrature-phase signal to form a first differential output signal and a second differential output signal and to dynamically modulate a phase difference between the first differential output signal and the second differential output signal responsive to a power of the RF input signal; a first differential-to-single-ended conversion circuit configured to convert the first differential output signal to form a first single-ended output signal; a second differential-to-single-ended conversion circuit configured to convert the second differential output signal to form a second single-ended output signal; one or more first amplifiers configured to amplify the first single-ended output signal to form a first amplified RF signal; one or more second amplifiers configured to amplify the second single-ended output signal to form a second amplified RF signal; and a combiner configured to combine the first amplified RF signal and the second amplified RF signal to form a combined RF output signal.

Other aspects, features, and implementations of the present disclosure will become apparent to those of ordinary skill in the art, upon reviewing the following description of specific, exemplary implementations of the present disclosure in conjunction with the accompanying figures. While features of the present disclosure may be discussed relative to certain implementations and figures below, all implementations of the present disclosure can include one or more of the advantageous features discussed herein. In other words, while one or more implementations may be discussed as having certain advantageous features, one or more of such features may also be used in accordance with the various implementations of the disclosure discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various implementations and to explain various principles and advantages in accordance with the present disclosure.

Implementations of the present disclosure and their advantages are best understood by referring to the detailed description that follows. It should be appreciated that like reference numerals are used to identify like elements illustrated in one or more of the figures.

DETAILED DESCRIPTION

To improve the efficiency and linearity of Doherty amplifiers, phase-reconfigurable circuits has been developed in which the phase difference between the input signal to the carrier amplifier and the input signal to the peaking amplifier may be set to an arbitrary value. Although such a variable input phase difference is beneficial, challenges remain with respect to the linearity of a Doherty amplifier. The linearity of a Doherty power amplifier may be characterized in a number of ways. For example, a first measure of linearity is known as an AM-AM measurement, where AM denotes amplitude modulation. In an AM-AM characterization of an amplifier, the input signal is an unmodulated sinusoid. The output sinusoid should have a linear relationship to this input sinusoid but as the input signal power is increased, eventually the output sinusoid will have a non-linear distortion with respect to the input sinusoid. An AM-AM measurement characterizes this non-linear distortion. Another measure of linearity is known as an AM-PM measurement, where PM denotes phase modulation. A sinusoid is again input to the power amplifier and the input power gradually increased. A phase of the output signal should stay steady but will inevitably begin to change as the input power is increased. The AM-PM measurement characterizes the linearity of the output phase as a function of the input signal power.

Load modulation perturbs the desired flatness of the AM-AM and AM-PM performance of a Doherty amplifier despite the use of a phase-reconfigurable input circuit providing an arbitrary phase difference between the carrier and peaking input signals. In addition, the instantaneous peak power of a Doherty amplifier is lowered by the class C biasing of the peaking amplifier to facilitate load modulation. A Doherty amplifier is thus disclosed herein with an improved phase-reconfigurable input circuit to provide enhanced linearity. The phase-reconfigurable input circuit disclosed herein will be referred to simply as an "input circuit" in the following discussion for brevity. To provide improved linearity, the input circuit not only introduces an arbitrary static phase difference between the carrier and peak input signals but also dynamically modulates the phase difference responsive to a power of the input signal. The resulting dynamic modulation of the phase difference improves the linearity of the Doherty amplifier. Although the following discussion will be directed to a Doherty amplifier implementation, it will be appreciated that the input circuit disclosed herein is readily applicable to any suitable dual-input power amplifier such as a balanced amplifier or a load-modulated balanced amplifier.

Figure 1A:
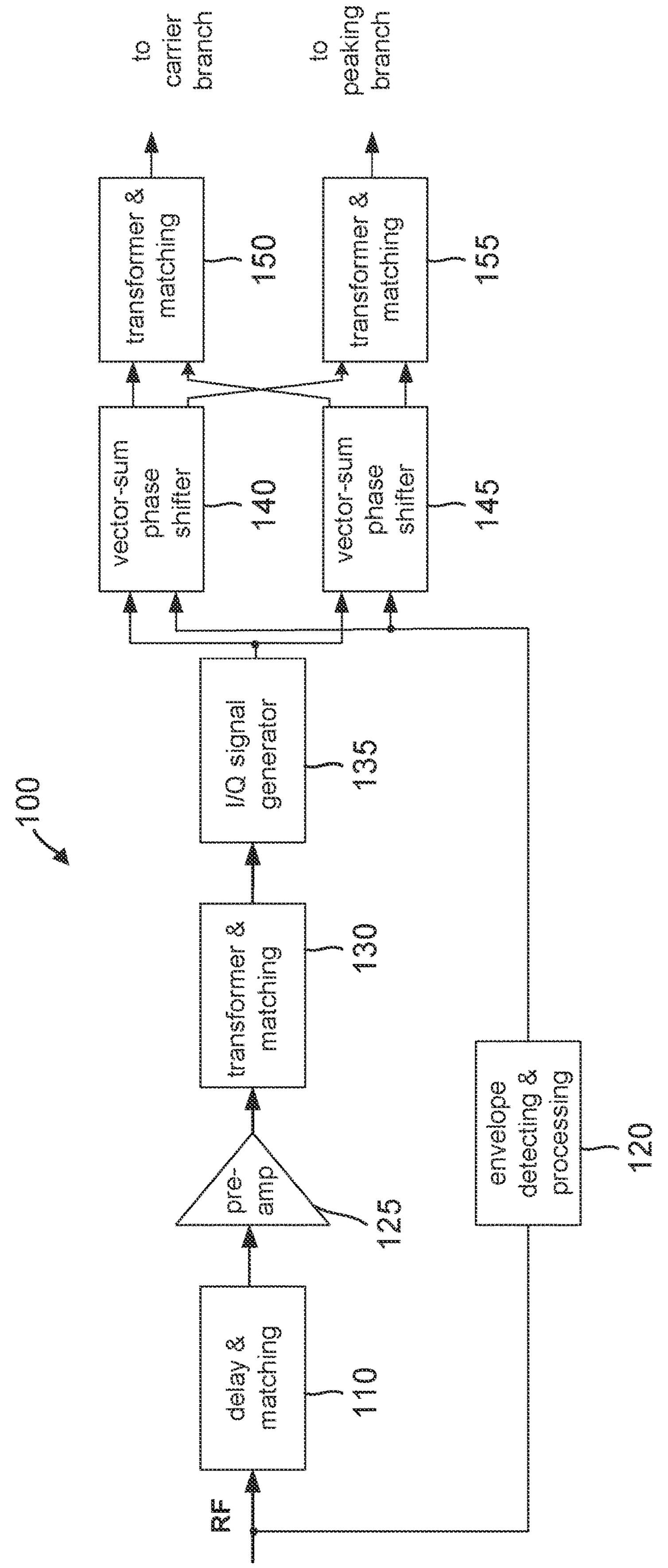
FIG. 1A illustrates a phase-reconfigurable circuit with dynamic phase modulation for a dual-input amplifier in accordance with an aspect of the disclosure.
Figure 1B:
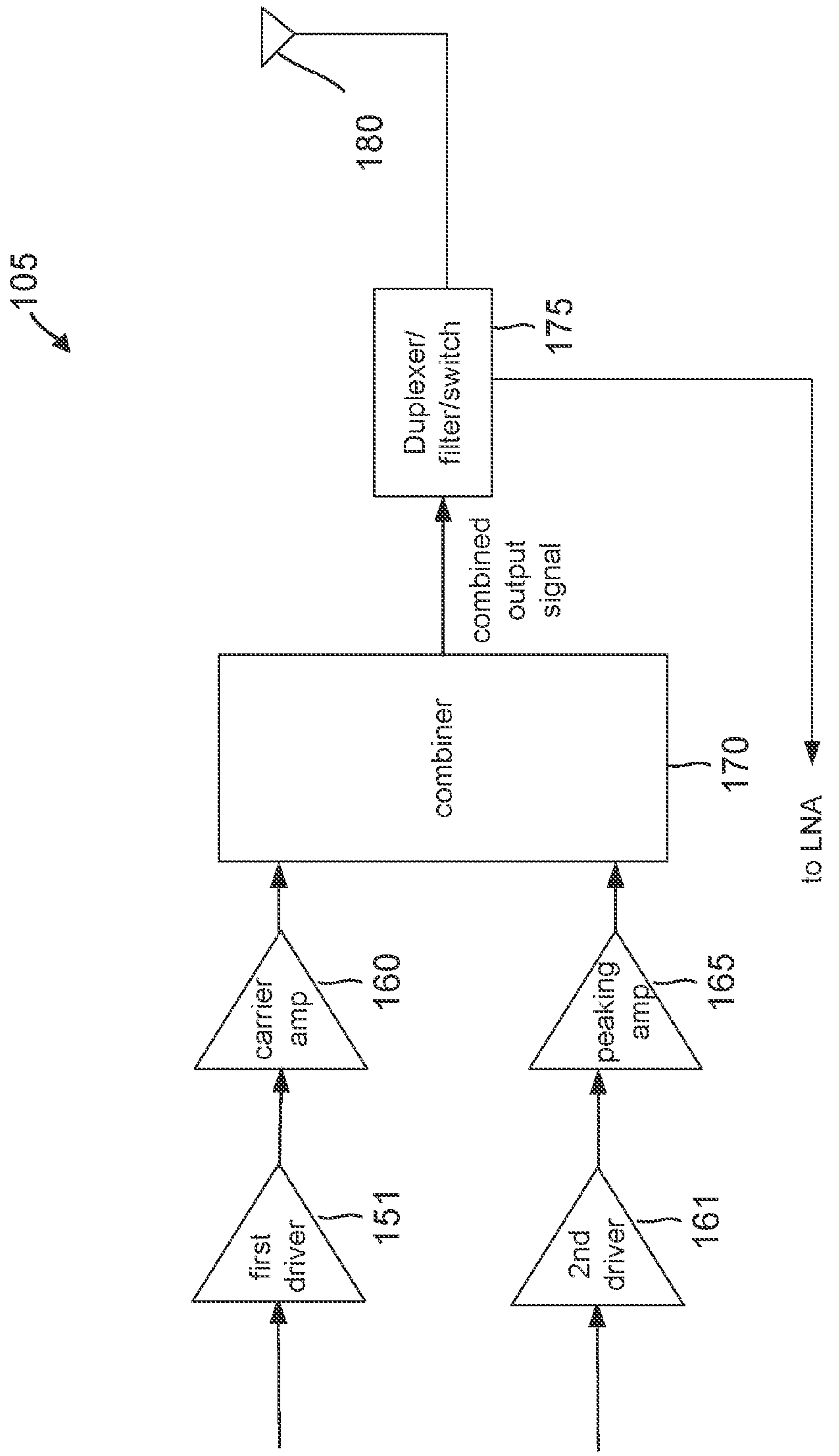
FIG. 1B illustrates a portion of a Doherty amplifier system for amplifying the output signals from the phase-reconfigurable circuit of FIG. 1A in accordance with an aspect of the disclosure.

An example input circuit 100 is shown in FIG. 1A whereas a remaining portion 105 of a Doherty amplifier transceiver is shown in FIG. 1B. In the input circuit 100, an input radio frequency (RF) signal is delayed and impedance matched in a delay and matching circuit 110 to produce a delayed and matched signal. A pre-amplifier (pre-amp) 125 amplifies the delayed and matched signal to produce a pre-amplified signal that is processed through a single-ended-to-differential converter such as a transformer and impedance matching circuit 130 to produce a transformed signal. The single-ended-to-differential converter thus converts a version of the RF input signal as processed through the delay and matching circuit 110 and the pre-amplifier 125. For illustration clarity, the transformed signal produced by the transformer and matching circuit 130 is shown in single-ended form in FIG. 1A. This differential signal may then be converted into in-phase and quadrature-phase signals in an I/Q signal generator 135 to produce a differential in-phase and differential quadrature-phase output signal. For illustration clarity, the differential in-phase and quadrature phase output signals from the I/Q signal generator 135 are again illustrated as single-ended signals in FIG. 1A.

To determine the input signal power for the dynamic phase modulation, an envelope detecting and processing circuit 120 detects the envelope of the input signal and processes the envelope into a differential envelope signal that is a function of the input signal envelope. For illustration clarity, the differential envelope signal is also illustrated as a single-ended signal in FIG. 1A. The differential in-phase and quadrature-phase signals and the differential envelope signal are then processed in a pair of vector-sum phase shifter circuits 140 and 145 to form differential carrier-branch and peaking-branch signals that are again illustrated in single-ended form for illustration clarity. The differential carrier branch signal may also be denoted as a first differential output signal herein. Similarly, the differential peaking-branch signal may also be denoted as a second differential output signal herein. The differential carrier branch signal is transformed to single-ended form in a first differential-to-single-ended converter circuit such as a transformer and impedance matching circuit 150 to drive a first driver amplifier 151 in the portion 105 (FIG. 1B). In turn, the first driver amplifier 151 drives a carrier amplifier 160.

Referring again to the input circuit 100, the differential peaking branch signal is transformed to single-ended form in a second differential-to-single-ended converter circuit such as a transformer and impedance matching circuit 155 to drive a second driver amplifier 161 in portion 105. In turn, the second driver amplifier 161 drives a peaking amplifier 165. The amplified output signals from the carrier amplifier 160 and the peaking amplifier 165 are combined in a combiner 170 to produce a combined output signal. A combined duplexer, filter, and antenna switch 175 processes the combined output signal to drive one or more antennas 180. A received signal from the antenna(s) 180 couples through the duplexer 175 before being amplified by a low-noise amplifier (LNA) (not illustrated).

Figure 2:
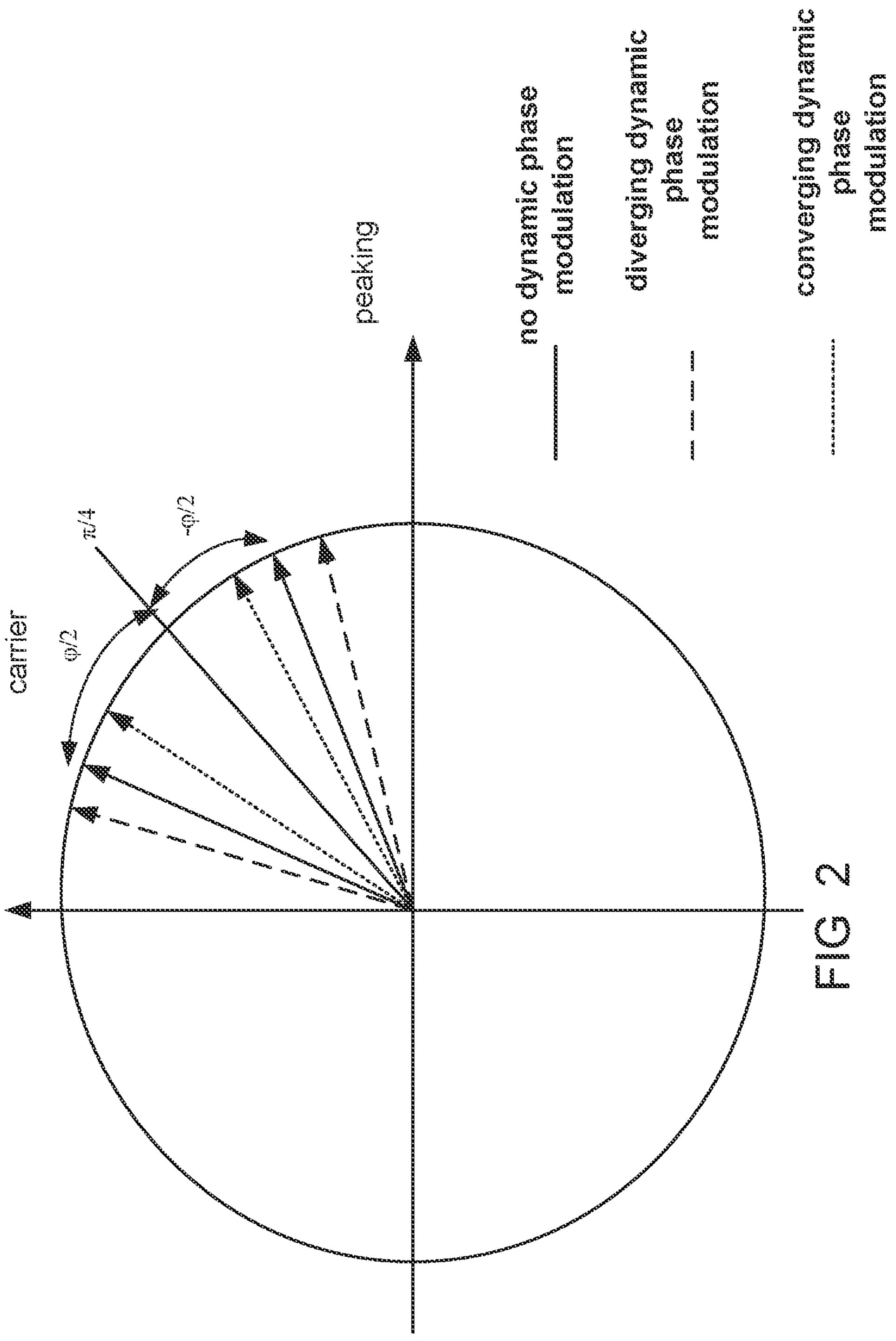
FIG. 2 is a phasor diagram of the carrier and peaking input signals with dynamic phase modulation in accordance with an aspect of the disclosure.

To provide a better appreciation of the dynamic phase modulation provided by the input circuit 100, some basic concepts will now be discussed, followed by a more detailed discussion of the input circuit's various components. Recall that a traditional phase-reconfigurable circuit may introduce an arbitrary static phase difference between the carrier and peaking input signals. This phase difference may be expressed using a phasor representation of the carrier and peaking input signals produced. It may be shown that the carrier input signal (for example, the carrier input signal voltage) may be represented in phasor form by $(1+j)\exp(+j\,\varphi/2)$ whereas the peaking input signal may be represented by $(1+j)\exp(-j\,\varphi/2)$, where j is the imaginary number equaling the square root of −1. These phasors are illustrated using a unit circle as shown in FIG. 2 in which the y axis represents an imaginary component and the x axis represents the real component. With respect to an angle of $\pi/4$, the carrier phasor is advanced in phase by an angle of $\varphi/2$ whereas the peaking phasor is decreased from $\pi/4$ in phase by an angle of $\varphi/2$. It may be seen that if $\varphi/2$ itself equaled $\pi/4$, the classic phase difference between the carrier and peaking input signals of 90 degrees is achieved.

Regardless of the value of the static phase difference φ between the carrier and peaking input signals, the dynamic phase modulation disclosed herein may either increase the phase difference or decrease it depending upon the power of the input signal. In that regard, the dependency of the phase modulation on the input signal power may be characterized by a factor x, where x is a function of the input signal power. Depending upon how it is applied, the factor x may represent either a phase divergence (an increase over the static phase difference φ) or a phase convergence (a decrease from the static phase difference φ) between the carrier and peaking input signals. For example, suppose that x is applied so as to cause a phase divergence. In a phasor representation with phase divergence as a function x of the input signal power, it may be shown that the carrier input signal voltage may be represented in phasor form by $(1+j)\exp(+j\,\varphi/2+x)$. Assuming that x is small compared to $\varphi/2$, this phasor form may be expanded as shown in the following Equation (1):

$$Vcarrier = \cos(\varphi/2)(1-x) - \sin(\varphi/2)(1+x) + j\big(\sin(\varphi/2)(1-x) + \cos(\varphi/2)(1+x)\big) \quad \text{Eq. (1)}$$

where Vcarrier is the carrier input signal voltage waveform. Similarly, after expansion the peaking input signal voltage may be represented by the following Equation (2):

$$Vpeaking = \cos(\varphi/2)(1+x) + \sin(\varphi/2)(1-x) + j\big(-\sin(\varphi/2)(1+x) + \cos(\varphi/2)(1-x)\big) \quad \text{Eq(2)}$$

where Vpeaking is the peaking input signal voltage waveform.

With regard to these expanded expressions for the carrier and peaking input signals, it may be shown that the phase difference between the carrier and peaking input signals may be either increased (a diverging phase modulation) or decreased (a converging phase modulation) depending upon how the envelope modulation signal is derived from the envelope detection and processing circuit 120. Examples of the carrier and peak input signals with a diverging phase modulation and also with a converging phase modulation are also shown in FIG. 2.

Figure 3:
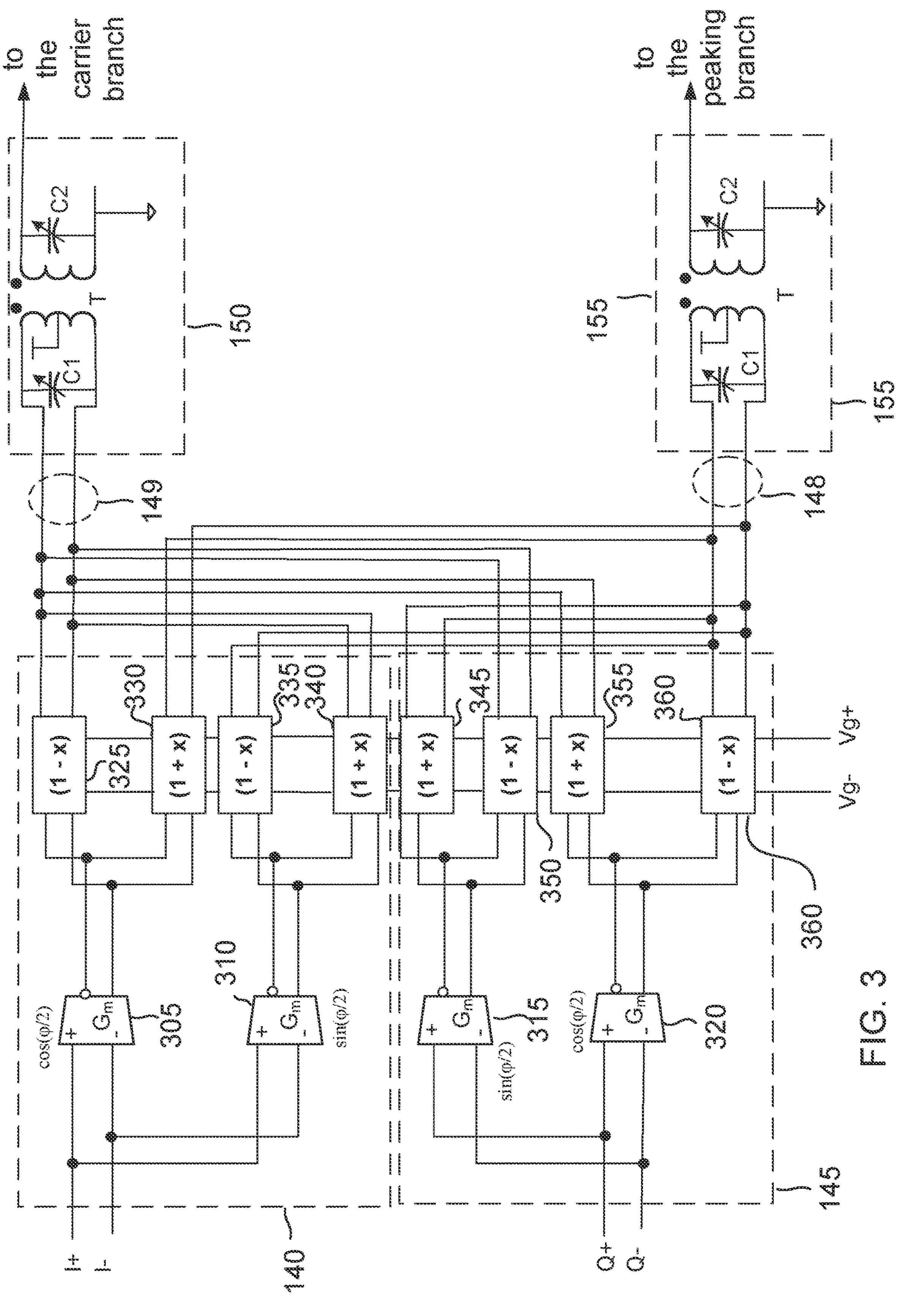
FIG. 3 is a conceptual diagram of the vector-sum phase shifters in the phase-reconfigurable circuit of FIG. 1A in accordance with an aspect of the disclosure.

The pair of vector-sum phase shifters 140 and 145 are shown in conceptual form in FIG. 3 to implement the phasor representations of Equations (1) and (2). As noted earlier, the I/Q signal generator 135 of FIG. 1 produces a differential in-phase output signal that is designated as I+ and I− in FIG. 3. Similarly, the differential quadrature-phase output signal from the I/Q signal generator 135 is designated as Q+ and Q− in FIG. 3. The differential envelope signal of FIG. 1 is represented by Vg+ and Vg− in FIG. 3. The pair of vector-sum phase shifters 140 and 145 functions so as to drive the transformer and impedance matching circuit 150 with a differential version (which may also be denoted herein a first differential output signal) of the carrier input signal as defined by Equation (1). The vector-sum phase shifters 140 and 145 thus couple to a first pair of output terminals 149 to drive the transformer and impedance matching circuit 150 with the first differential output signal.

In the vector-sum phase shifter 140, a variable transconductance amplifier 305 transconducts the differential in-phase signals I+ and I− with a gain of $\cos(\varphi/2)$ to produce a differential output signal. A circuit 325 mixes the differential output signal from the variable transconductance amplifier 305 with the differential envelope signal so as to multiply the differential output signal with a factor of (1−x). Circuit 325 thus produces a differential version of $$\cos(\varphi/2)(1-x)$$

from Equation (1). This signal drives the transformer and impedance matching circuit 150, which will be discussed further below.

A variable transconductance amplifier 310 transconducts the differential in-phase signals I+ and I− with a gain of sin(φ/2) to produce a differential output signal. A circuit 340 mixes the differential output signal from the variable transconductance amplifier 310 with the differential envelope signal so as to multiply the pair of differential output signals with a factor of (1+x). Circuit 340 thus produces a differential version of $$\sin(\varphi/2)(1+x).$$

This differential version of $$\sin(\varphi/2)(1+x)$$

couples in a complementary fashion to the transformer and impedance matching circuit 150 to drive the transformer and impedance matching circuit 150 with a differential version of $$-\sin(\varphi/2)(1+x)$$

Equation (1).

In the vector-sum phase shifter 145, a variable transconductance amplifier 315 transconducts the differential in-phase signals Q+ and Q− with a gain of sin(φ/2) to produce a differential output signal. A circuit 350 mixes the differential output signal from the variable transconductance amplifier 315 with the differential envelope signal so as to multiply the differential output signal with a factor of (1−x). Circuit 350 thus produces a differential version of $$j\sin(\varphi/2)(1-x).$$

This differential version of $$j\sin(\varphi/2)(1-x)$$

couples to the transformer and impedance matching circuit 150 to drive the transformer and impedance matching circuit 150 with a differential version of $$j\sin(\varphi/2)(1-x)$$

from Equation (1).

To complete Equation (1), a variable transconductance amplifier 320 in the vector-sum phase shifter 145 transconducts the differential in-phase signals Q+ and Q− with a gain of cos(φ/2) to produce a differential output signal. A circuit 355 mixes the differential output signal from the variable transconductance amplifier 320 with the differential envelope signal so as to multiply the differential output signal with a factor of (1+x). Circuit 355 thus produces a differential version of $$j\cos(\varphi/2)(1+x).$$

This differential version of $$j\cos(\varphi/2)(1+x)$$

couples to the transformer and impedance matching circuit 150 to drive the transformer and impedance matching circuit 150 with a differential version of $$j\cos(\varphi/2)(1+x)$$

from Equation (1). The vector-sum phase shifters 140 and 145 thus drive the transformer and impedance matching circuit 150 with a differential version of the carrier input signal as defined by Equation (1).

The vector-sum phase shifters 140 and 145 are constructed analogously so that the transformer and impedance matching circuit 155 is driven with a differential version (which may also be denoted herein as a second differential output signal) of the peaking input signal as defined by Equation (2). The vector-sum phase shifters 140 and 145 thus couple to a second pair of output terminals 148 to drive the transformer and impedance matching circuit 155 with the second differential output signal. In particular, a circuit 330 mixes the differential output signal from the variable transconductance amplifier 305 with the differential envelope signal so as to multiply the differential output signal with a factor of (1+x). Circuit 330 thus produces a differential version of $$\cos(\varphi/2)(1+x).$$

This differential version of $$\cos(\varphi/2)(1+x)$$

couples to the transformer and impedance matching circuit 155 to drive the transformer and impedance matching circuit 155 with a differential version of $$\cos(\varphi/2)(1+x)$$

from Equation (2).

A circuit 335 mixes the differential output signal from the variable transconductance amplifier 310 with the differential envelope signal so as to multiply the differential output signal with a factor of (1+x). Circuit 335 thus produces a differential version of $$\sin(\varphi/2)(1-x).$$

This differential version of $$\sin(\varphi/2)(1-x)$$

couples to the transformer and impedance matching circuit 155 to drive the transformer and impedance matching circuit 155 with a differential version of $$\sin(\varphi/2)(1-x)$$

from Equation (2).

In addition, a circuit 345 mixes the differential output signal from the variable transconductance amplifier 315 with the differential envelope signal so as to multiply the differential output signal with a factor of (1+x). Circuit 345 thus produces a differential version of $$j\sin(\varphi/2)(1+x).$$

The differential version of $$j\sin(\varphi/2)(1+x)$$

couples to the transformer and impedance matching circuit 155 in a complementary fashion to drive the transformer and impedance matching circuit 155 with a differential version of $$-j\sin(\varphi/2)(1+x)$$

from Equation (2).

Finally, a circuit 360 mixes the differential output signal from the variable transconductance amplifier 320 with the differential envelope signal so as to multiply the differential output signal with a factor of (1−x). Circuit 360 thus produces a differential version of $$j\cos(\varphi/2)(1-x).$$

This differential version of $$j\cos(\varphi/2)(1-x)$$

couples to the transformer and impedance matching circuit 155 to drive the transformer and impedance matching circuit 155 with a differential version of $$j\cos(\varphi/2)(1-x)$$

from Equation (2). The vector-sum phase shifters 140 and 145 thus drive the transformer and impedance matching circuit 155 with a differential version of the peaking input signal as defined by Equation (2).

In the following discussion it will be assumed that the antenna(s) such as antenna 180 of FIG. 1B are driven with single-ended signals. The transformer and impedance matching circuits 150 and 155 thus function as differential-to-single-ended converter circuits to convert the differential signals from the vector-sum phase shifters 140 and 145 into single-ended signals. However, it will be appreciated that differential signals may instead be used in alternative implementations for the driving of the antennas. To perform the differential-to-single-ended conversion, each transformer and impedance matching circuit 150 and 155 include a center-tapped transformer T. To match the input and output impedances, a primary winding of each transformer T couples in parallel with a variable capacitor C1. Similarly, a secondary winding of each transformer T couples in parallel with a variable capacitor C2.

Figure 4:
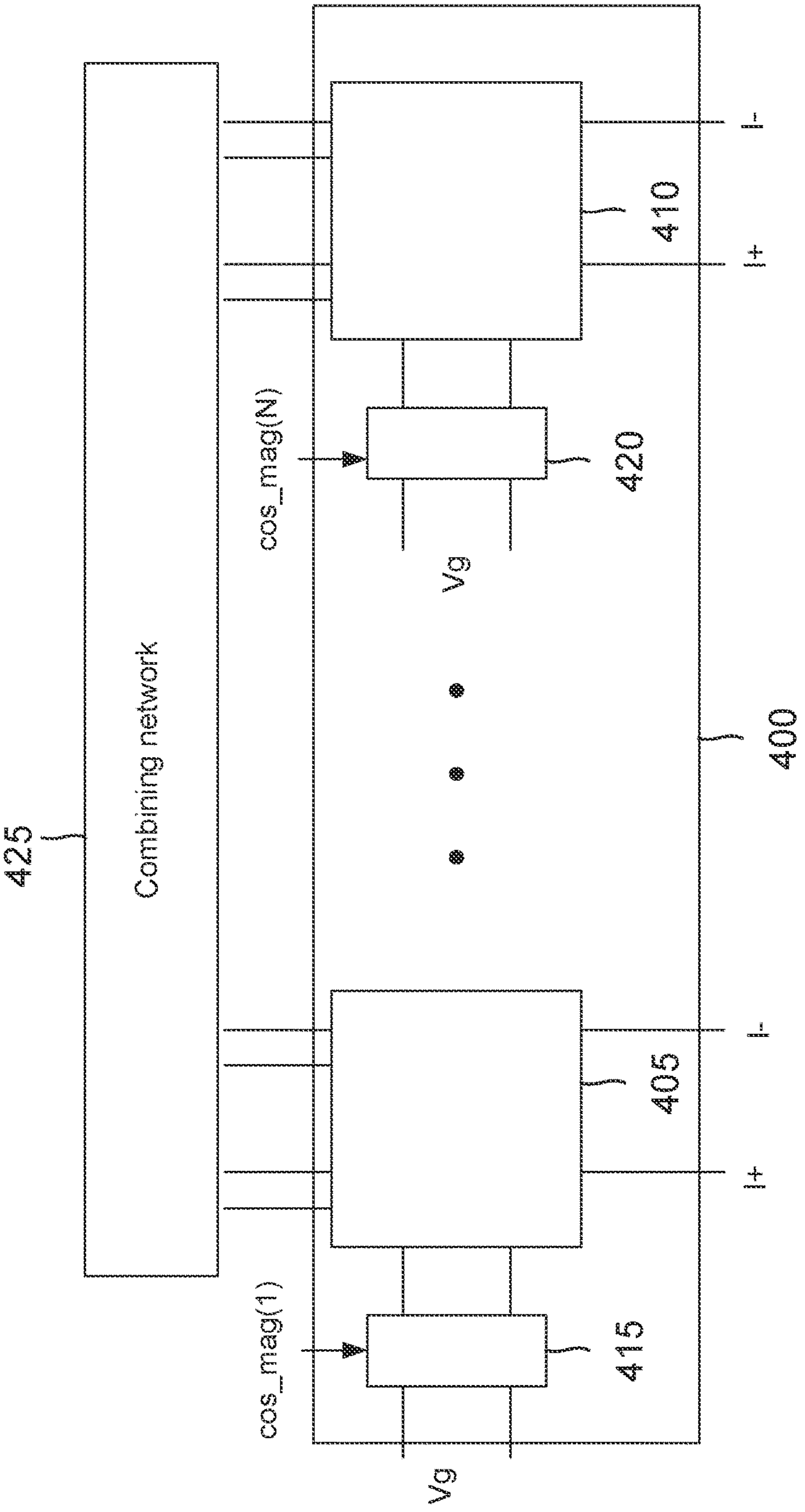
FIG. 4 illustrates a plurality of circuits for forming a portion of a vector-sum phase shifter with dynamic phase modulation in accordance with an aspect of the disclosure.

The vector-sum phase shifters 140 and 145 may each be implemented using a suitable circuit having a mixer-like topology. The following discussion will thus be directed to mixer-like implementations of the vector-sum phase shifters 140 and 145 without loss of generality. As defined herein, a circuit is deemed to be a "mixer-like" circuit when the circuit has the topology of a mixer but does not frequency translate its output signal(s). Note that each of Equations (1) and (2) has four terms each, with two cosine terms and two sine terms. Each term may be formed by a corresponding plurality of mixer-like circuits. An example plurality of N mixer-like circuits 400 is shown in FIG. 4 ranging from a first circuit 405 to an Nth circuit, where N is a plural positive integer. Each circuit is digitally controlled to provide the desired cosine or sine proportionality. Referring again to the cosine and sine terms of Equations (1) and (2), it may be seen that there are two real terms and two imaginary terms. The real terms depend upon the in-phase signal from the I/Q signal generator 135 (FIG. 1A) whereas the imaginary terms depend upon the quadrature-phase differential signal from the I/Q signal generator 135. The plurality of circuits 400 respond to the in-phase differential signal so as to produce one of the real terms but it will be appreciated that the plurality of circuits 400 could instead respond to the quadrature-phase differential signal in an alternative implementation. Each circuit functions to multiply the in-phase differential signal with the envelope differential signal to produce the desired (1+x) or (1−x) term. For example, suppose that the term being produced is $$\cos(\varphi/2)(1+x).$$

Within the plurality of N circuits, a corresponding number of circuits are activated to each produce the (1+x) term, where N is positive plural integer. The combination of the active circuits from the plurality of circuits 400 thus produces the desired $$\cos(\varphi/2)(1+x)$$

term.

With respect to activating individual circuits in the plurality of circuits 400, an N-bit wide digital control word cos_mag controls which ones of the circuits are active. The N circuits are arranged from a first circuit 405 to an Nth circuit 410. A first bit cos_mag(1) of the digital control word controls a switch 415 for the first circuit 405. Should switch 415 be open (not conducting), it gates the differential envelope signal Vg from being mixed in the circuit 405. But if the switch 415 is closed (conducting), circuit 405 is active and mixes the envelope differential signal Vg with the in-phase differential signal. Similarly, a switch 420 controlled by an Nth bit cos_mag(N) of the digital control word controls whether the Nth circuit 410 is active or not. Each of the remaining circuits has its own corresponding switch analogous to switches 415 and 420. A combining network 425 combines the output signals from the active circuits to drive the peaking and carrier branches as will be explained further herein.

Figure 5:
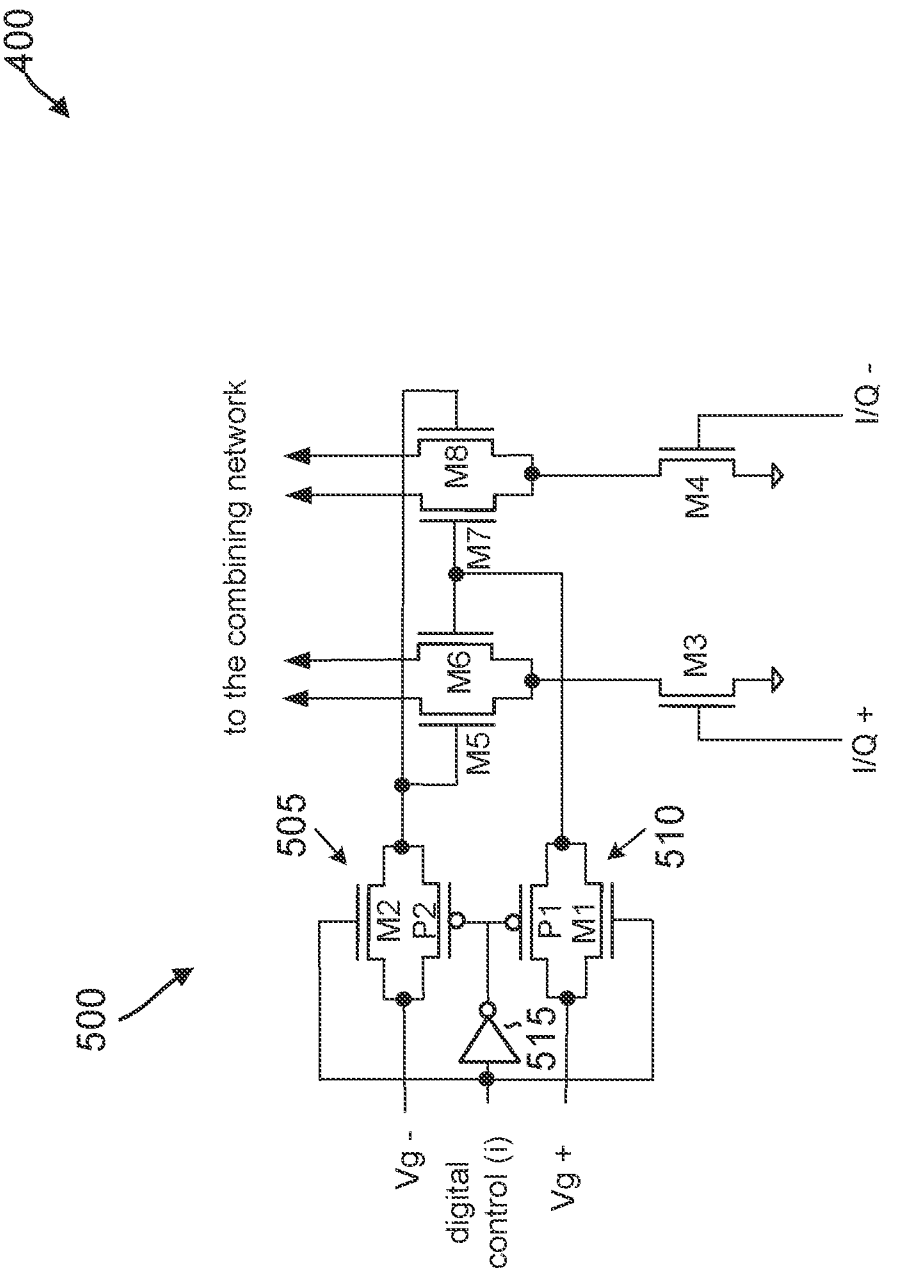
FIG. 5 illustrates an example circuit for a vector-sum phase shifter with dynamic phase modulation in accordance with an aspect of the disclosure.

The mixer-like circuits disclosed herein may be constructed analogously to a Gilbert cell mixer. An example Gilbert-cell mixer-like circuit 500 is shown in more detail in FIG. 5. Circuit 500 is the ith circuit in a corresponding plurality of N circuits, where i is an integer ranging from 1 to N. Circuit 500 is thus controlled by the ith bit from the corresponding digital control word as represented by an ith digital control bit. In circuit 500, the switch is formed by a pair of transmission gates 505 and 510 that in turn are formed by a pair of n-type metal-oxide semiconductor (NMOS) transistors M1 and M2 and a pair of p-type metal-oxide semiconductor (PMOS) transistor P1 and P2. Should the ith digital control bit be asserted to a power supply voltage, the transmission gates 505 and 510 conduct. In particular, the ith digital control bit drives the gates of transistors M1 and M2 such that these transistors conduct when the ith digital control bit is asserted to the power supply voltage. An inverter 515 inverts the ith digital control bit to drive the gates of the transistors P1 and P2. Transistors P1 and P2 thus also conduct when the ith digital control bit is asserted to the power supply voltage.

Circuit 500 also includes a differential pair of NMOS transistors M5 and M6 as well as another differential pair of NMOS transistors M7 and M8. The sources of transistors M5 and M6 couple to ground through an NMOS transistor M3. Similarly, the sources of transistors M7 and M8 couple to ground through an NMOS transistor M4. Depending upon the sinusoidal term being implemented, either the in-phase signal or the quadrature-phase signal from the I/Q signal generator 135 (FIG. 1) drives the gates of the transistors M3 and M4. In particular, the positive component drives the gate of transistor M3 whereas the negative component drives the gate of transistor M4.

Assuming the circuit 500 is active, the positive component Vg+ of the envelope differential signal couples through transmission gate 510 to drive the gates of transistors M6 and M7. Similarly, the negative component Vg− of the envelope differential signal couples through the transmission gate 505 to drive the gates of transistors M5 and M8. The drains of transistors M5, M6, M7, and M8 couple to the combining network (not illustrated).

Figure 6:
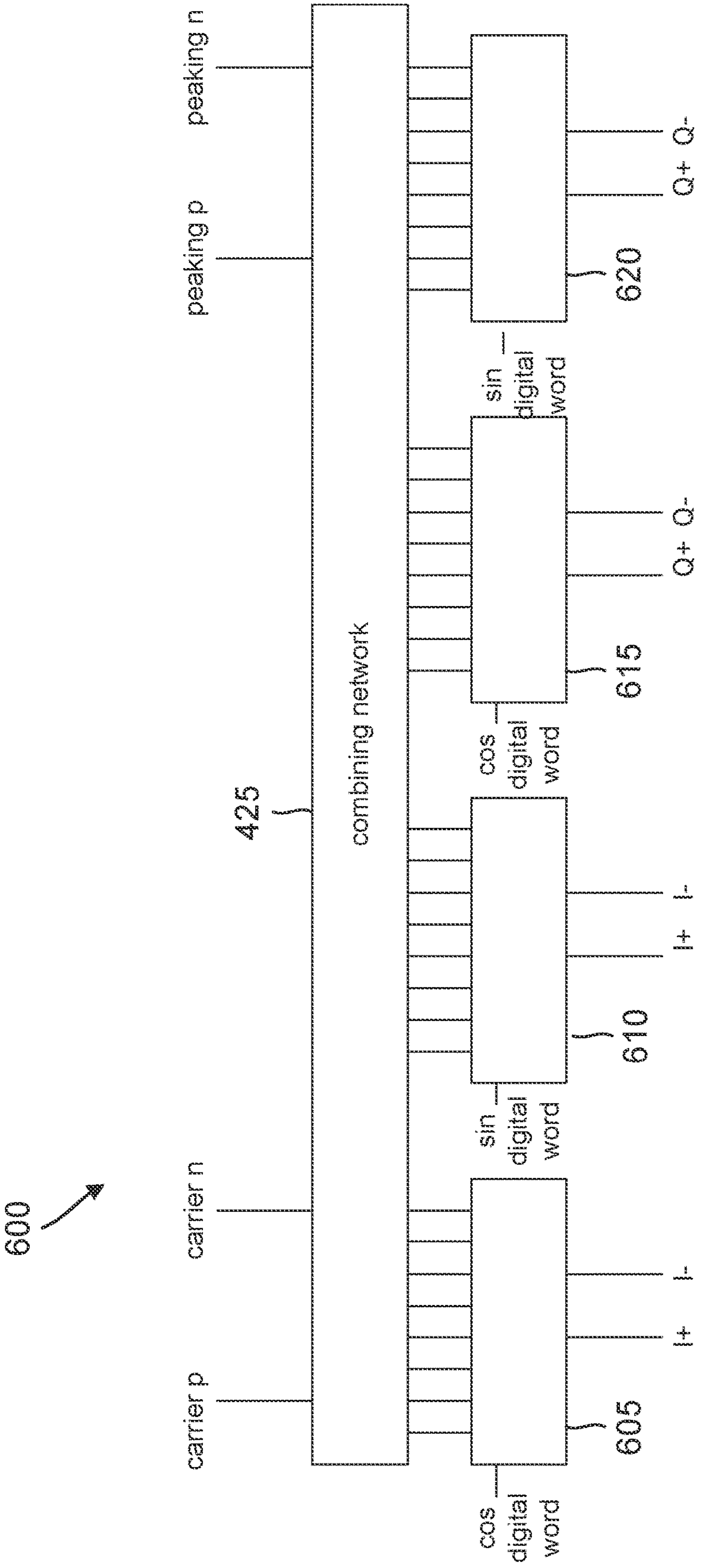
FIG. 6. illustrates a vector-sum phase shifter with dynamic phase modulation in accordance with an aspect of the disclosure.

An example vector-sum phase shifter 600 is shown in FIG. 6. As discussed previously with respect to the four terms of Equations (1) and (2), vector-sum phase-shifter 600 includes four corresponding pluralities of N mixer-like circuits. In particular, a first plurality of N mixer-like circuits 605 and a second plurality of N mixer-like circuits 610 each responds to the in-phase differential signal. The first plurality 605 is gated by a cos magnitude digital word (which also may be designated herein as a first digital word) so that the first plurality 605 produces the real cosine term of either Equation (1) or Equation (2) as coupled through the combining network 425. Similarly, the second plurality 610 is gated by a sin magnitude digital word (which also may be designated herein as a second digital word) so that the second plurality 610 produces the real sine term of either Equation (1) or Equation (2). A third plurality of N mixer-like circuits 615 and a fourth plurality of N mixer-like circuits 620 each responds to the quadrature-phase differential signals to form the imaginary terms. In particular, the third plurality 615 is gated by a cos magnitude digital word (which also may be designated herein as a third digital word) to produce the imaginary cosine term of either Equation (1) or Equation (2) as coupled through the combining network 425. Similarly, the fourth plurality 620 is gated by a sin magnitude digital word (which also may be designated herein as a fourth digital word) so that the fourth plurality 620 produces the imaginary sine term of either Equation (1) or Equation (2). Combining network 425 combines the corresponding output signals from the pluralities of mixer-like circuits to produce a differential carrier signal to drive the transformer and impedance matching circuit 150 (FIG. 3). Similarly, combining network 425 combines the corresponding output signals from the pluralities of mixer-like circuits to produce a differential peaking signal to drive the transformer and impedance matching circuit 155 (FIG. 3).

Figure 7:
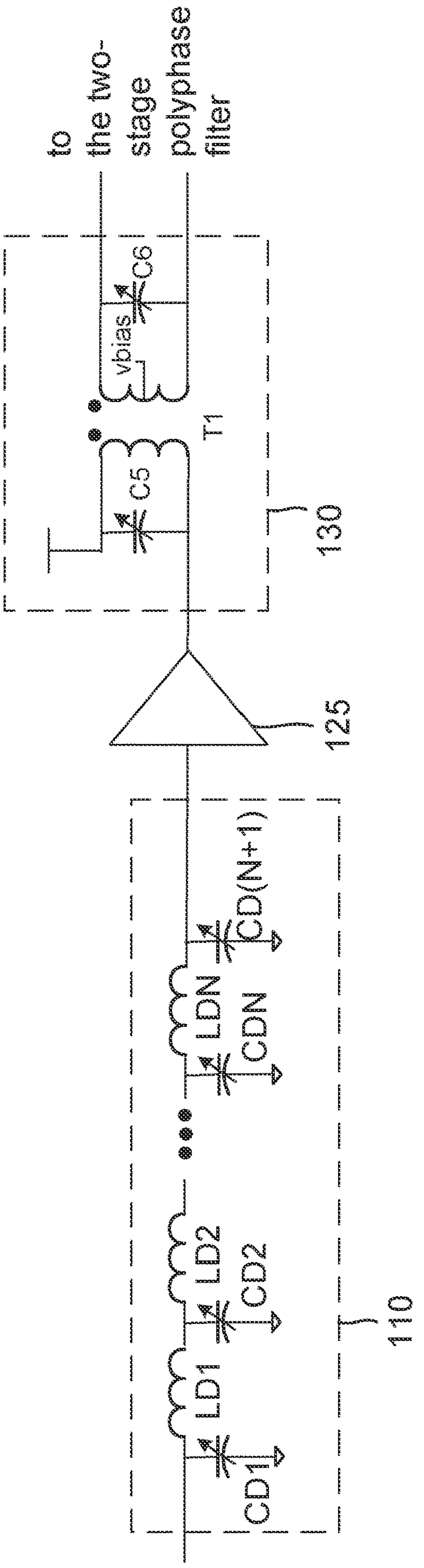
FIG. 7 is a circuit diagram for an example implementation of the delay and impedance matching circuit and the transformer and matching circuits in the phase-reconfigurable circuit of FIG. 1A in accordance with an aspect of the disclosure.

Referring again to the input circuit 100 of FIG. 1A, an example implementation of the delay and matching circuit 110, pre-amplifier 125, and transformer and matching circuit 130 is shown in more detail in FIG. 7. The delay and matching circuit 110 may be formed using one or more inductor-capacitor (LC) stages. For example, a first LC stage includes a variable capacitor CD1 and an inductor LD1. Similarly, a second LC stage includes a variable capacitor CD2 and an inductor LD2. To provide the desired amount of delay, the delay and matching circuit 110 may include a plurality of N LC stages that ends with an Nth LC stage including a variable capacitor CDN and an inductor LDN, where N is a plural positive integer. A final capacitor CD(N+1) completes the delay and matching circuit 110, which provides a delayed and matched output signal to the pre-amplifier 125. As an alternative to the LC stages, other circuits may be used to introduce the desired delay such as a delay line or an external filter. The transformer and impedance matching circuit 130 includes a transformer T1 that converts the single-ended output signal from the pre-amplifier 125 into a differential output signal that drives the I/Q signal generator 135 (FIG. 1A). A variable capacitor C5 couples in parallel with a primary winding of the transformer T1 for matching. Similarly, a variable capacitor C6 couples in parallel with a secondary winding of the transformer T1 for matching. In addition, a center tap of the secondary winding may be biased with a bias voltage Vbias to control the common mode voltage of the differential output signal.

Figure 8A:
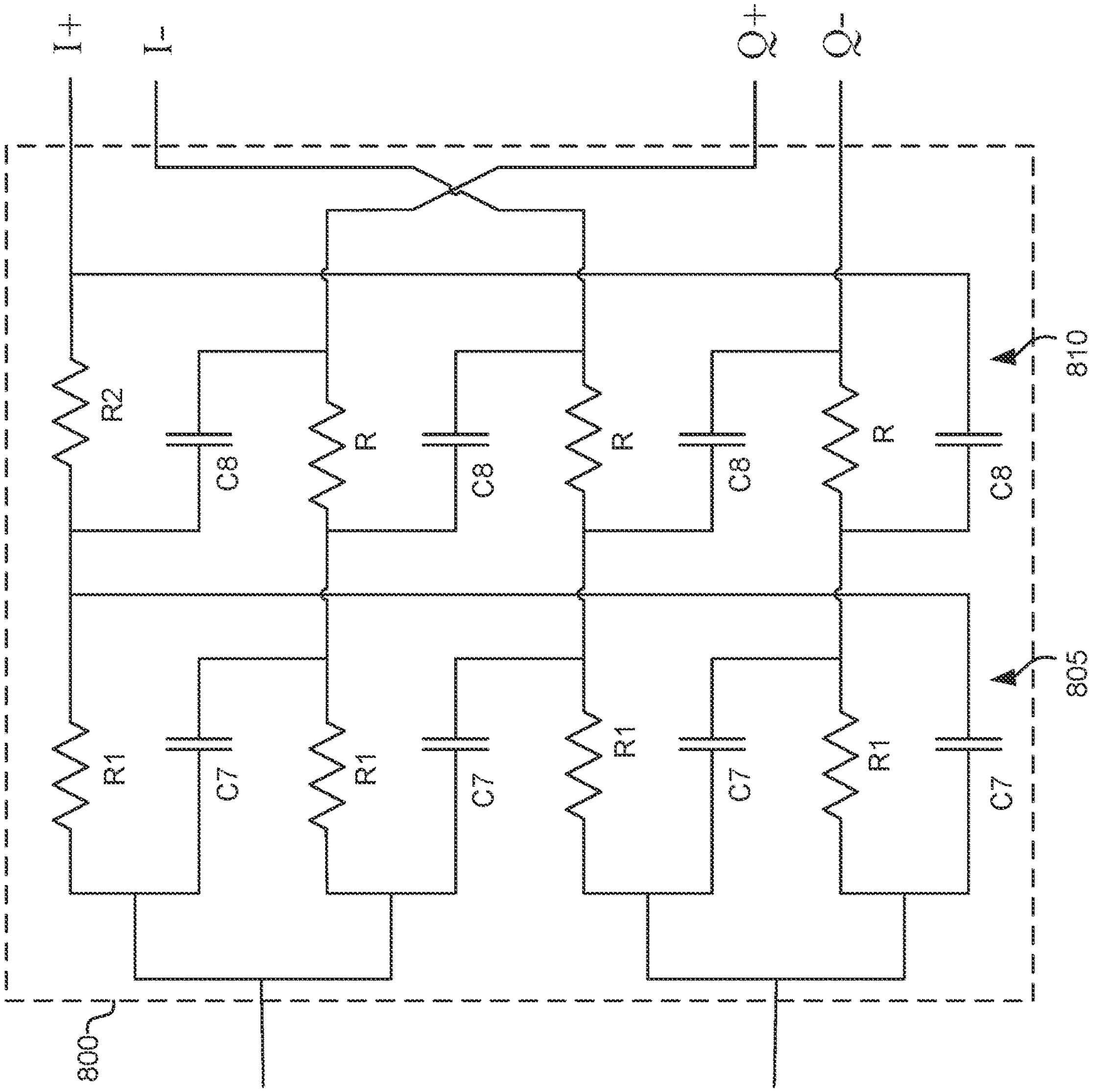
FIG. 8A is a circuit diagram of a two-stage RC polyphase filter for the I/Q generation in the phase-reconfigurable circuit of FIG. 1A in accordance with an aspect of the disclosure.

The I/Q signal generator 135 functions to convert the differential signal from the transformer and impedance matching circuit 130 into the differential in-phase and quadrature-phase signals. In some implementations, the I/Q signal generator 135 may be formed by a two-stage polyphase filter. Each stage of the two-stage polyphase filter may be formed using either a transconductance-capacitance (gm-C) topology or a resistor-capacitor (RC) topology. An example RC two-stage polyphase filter 800 for implementing the I/Q signal generator 135 is shown in FIG. 8A that includes a first stage 805 and a second stage 810. First stage 805 includes four resistors R1 arranged with four corresponding capacitors C7 to provide a first pole frequency that is a function of the resistance R1 and the capacitance C7. Similarly, second stage 810 includes four resistors R2 arranged with four corresponding capacitors C8 to provide a second pole frequency that is a function of the resistance R2 and the capacitance C8. A suitable setting of the two pole frequencies for the RC polyphase filter 800 leads to high quality differential signals I+, I−, Q+, and Q− with satisfactory phase and gain matching. As compared to a gm-C polyphase filter, the RC polyphase filter 800 consumes no current and is very linear. However, it will be appreciated that a gm-C polyphase filter may be used in alternative implementations.

Figure 8B:
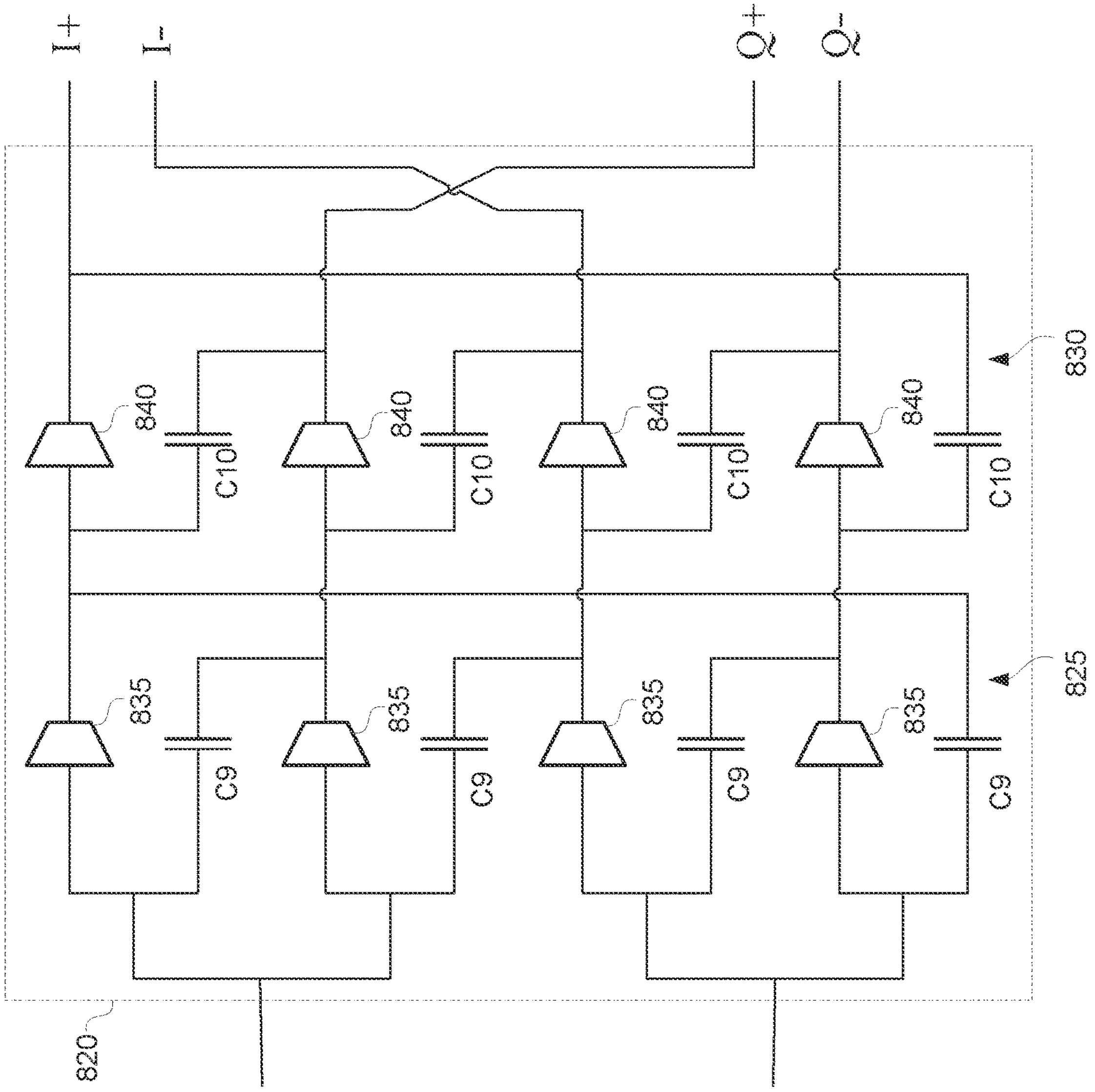
FIG. 8B is a circuit diagram of a two-stage gm-C polyphase filter for the I/Q generation in the phase-reconfigurable circuit of FIG. 1A in accordance with an aspect of the disclosure.

An example two-stage gm-C polyphase filter 820 for implementing the I/Q signal generator 135 is shown in FIG. 8B having a first stage 825 and a second stage 830. In the first stage 825, four transconductance amplifiers 835 each provides a first transconductance and are arranged with four corresponding capacitors C9 to create a first pole frequency that is a function of the first transconductance and the capacitance C9. Similarly, the second stage 830 includes four transconductance amplifiers 840 that each provides a second transconductance and are arranged with four corresponding capacitors C10 to create a second pole frequency that is a function of the second transconductance and the capacitance C10. By a suitable setting of the two pole frequencies, the polyphase filter 820 provides high quality differential signals I+, I−, Q+, and Q− having satisfactory phase and gain matching. In another passive implementation, a differential, transformer-based I/Q generation circuit may be used in lieu of a polyphase filter to form the I/Q generator 135 to generate the in-phase and quadrature-phase RF signals. Alternatively, a three-stage RC (or Gm-C) polyphase filter may be used to perform the I and Q conversion in alternative implementations.

A pre-amplifier may instead be inserted in between the vector-sum phase shifters 140 and 145 and the corresponding transformer and impedance matching circuits 150 and 155. In such an implementation, there may then be four single-ended pre-amplifiers such that the positive carrier branch input signal, the negative carrier branch input signal, the positive peaking branch input signal, and the negative peaking branch input signal are each pre-amplified by a corresponding pre-amplifier. Alternatively, such pre-amplifiers may be in addition to pre-amplifier 125. In other implementations, a pre-amplifier may instead be inserted between the transformer and the impedance matching portion in each of the transformer and impedance matching circuits 150 and 155. Note that these various pre-amplifier configurations may be in lieu of pre-amplifier 125 or may combined in part or in whole with pre-amplifier 125 in alternative implementations.

Figure 9:
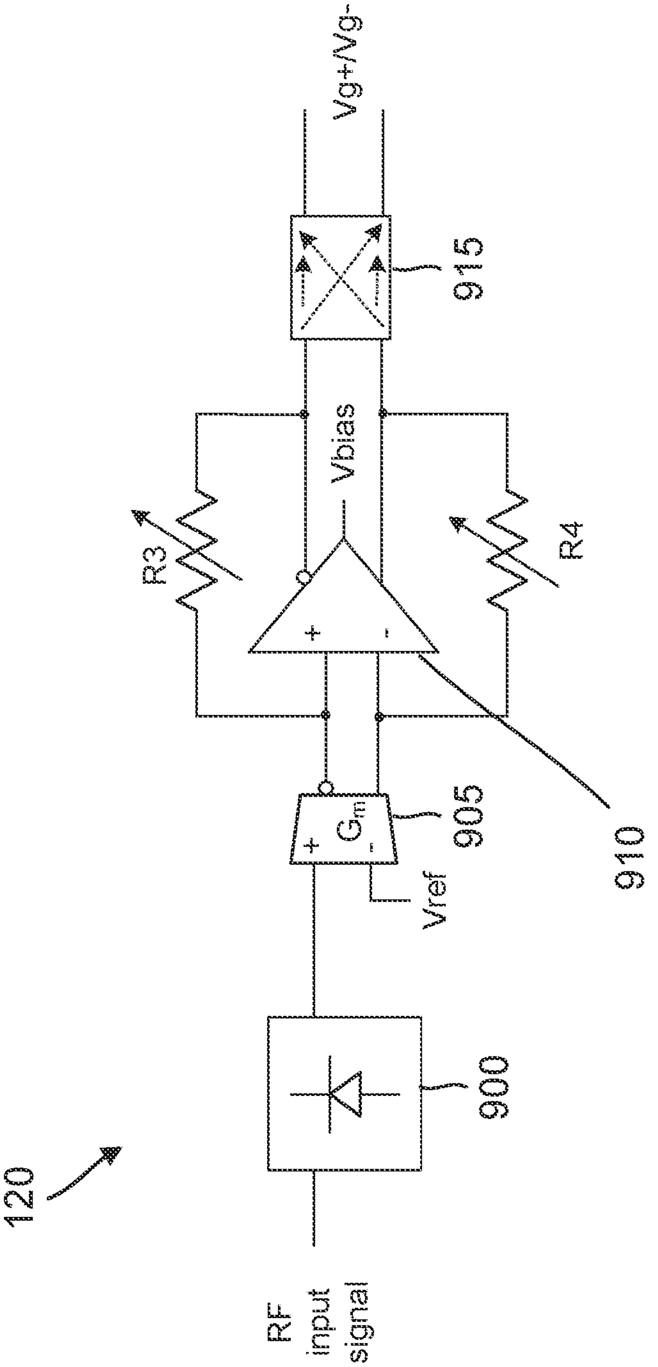
FIG. 9 is a circuit diagram of the envelope detector and processing circuit of FIG. 1A in accordance with an aspect of the disclosure.

An example envelope detecting and processing circuit 120 is shown in more detail in FIG. 9. An envelope detector 900 detects the envelope of the RF input signal and outputs a signal representative of the envelope to a positive input terminal of a transconductance amplifier 905. A voltage reference signal (Vref) biases a negative input terminal of the transconductance amplifier 905 so that a differential output signal from the transconductance amplifier is proportional to a difference between the envelope and the voltage reference signal. To provide improved driving capability, the differential output signal form the transconductance amplifier is amplified by a differential amplifier 910 that outputs an amplified differential signal. To provide tunability of the low-frequency gain to align the voltage swing of the amplified differential output signal and for adjustment of the group delay to reduce a group delay discrepancy between the forward path through the I/Q generator circuit 135 and the path through the envelope and processing circuit 120, the differential amplifier 910 couples to a variable resistor R3 and variable resistor R4 (note that the variable resistors R3 and R4 may be set to the same resistance since the differential amplifier 910 may be a differential trans-impedance amplifier). The variable resistor R3 couples between a negative output terminal of the differential amplifier 910 and its positive input terminal. Similarly, the variable resistor R4 couples between a positive output terminal of the differential amplifier 910 and its negative input terminal. An optional double-pole double-throw switch 915 couples between the output terminals of the differential amplifier 910 and the vector-sum phase shifters 140 and 145 (FIG. 1A). Depending upon the configuration of switch 915, the dynamic phase modulation in the vector-sum phase shifters 140 and 145 may be switched from a diverging phase difference (the phase difference between the carrier and the peaking input signals increasing from the static value) to a converging phase difference (the phase difference between the carrier and peaking input signals decreasing from the static value) and vice versa. A bias voltage Vbias controls the common-mode voltage of the differential envelope signal.

Figure 10:
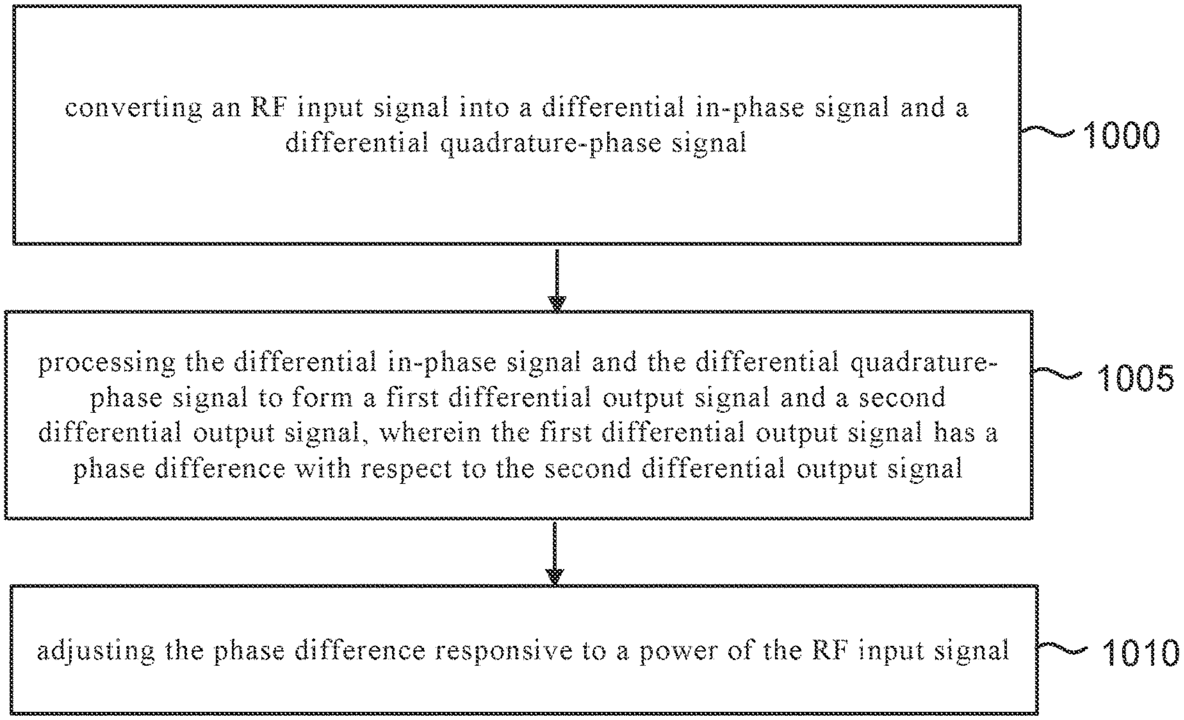
FIG. 10 is a flowchart for a phase-reconfigurable circuit method of operation in accordance with an aspect of the disclosure.

A dual-input amplifier method will now be discussed with regard to the flowchart of FIG. 10. The method includes an act 1000 of converting an RF input signal into a differential in-phase signal and a differential quadrature-phase signal. The conversion of the RF input signal through the delay and matching circuit 110, the transformer and impedance matching circuit 130, and I/Q generator circuit 135 to form the differential I and Q signals is an example of act 1000. In addition, the method includes an act 1005 of processing the differential in-phase signal and the differential quadrature-phase signal to form a first differential output signal and a second differential output signal, wherein the first differential output signal has a phase difference with respect to the second differential output signal and an act 1010 of adjusting the phase difference responsive to a power of the RF input signal. The dynamic modulation of the phase difference between the carrier branch and the peaking branch input signals by the first and second vector-sum phase shifters 140 and 145 is an example of acts 1005 and 1010.

The disclosure will now be summarized in the following example clauses:

Clause 1. A dual-input amplifier with dynamic phase modulation, comprising:

an envelope detector configured to process an envelope of an RF input signal to form an envelope signal;

a single-ended-to-differential converter configured to convert a version of the RF input signal into a differential RF input signal;

an I/Q generator circuit configured to convert the differential RF input signal into a differential in-phase signal and into a differential quadrature-phase signal;

a first vector-sum phase-shifter;

a second vector-sum phase-shifter;

a first pair of output terminals; and a second pair of output terminals, wherein the first vector-sum phase-shifter and the second vector-sum phase shifter are both configured to process the differential in-phase signal and the differential quadrature-phase signal to form a first differential output signal at the first pair of output terminals and to form a second differential output signal at the second pair of output terminals and to adjust a phase difference between the first differential output signal and the second differential output signal responsive to the envelope signal.

Clause 2. The dual-input amplifier of clause 1, wherein the I/Q generator circuit comprises a polyphase filter.

Clause 3. The dual-input amplifier of clause 2, wherein the polyphase filter comprises a transconductance-capacitor (gm-C) polyphase filter.

Clause 4. The dual-input amplifier of clause 2, wherein the polyphase filter comprises a resistor-capacitor (RC) polyphase filter.

Clause 5. The dual-input amplifier of clause 4, wherein the polyphase filter comprises a two-stage RC polyphase filter.

Clause 6. The dual-input amplifier of clause 3, wherein the gm-C polyphase filter comprises a two-stage gm-C polyphase filter.

Clause 7. The dual-input amplifier of any of clauses 1-6, wherein the envelope signal is a differential envelope signal, and wherein the dual-input amplifier further comprises:

a double-pole, double-throw switch configured to couple the differential envelope signal from the envelope detector to the first vector-sum phase-shifter and the second vector-sum phase-shifter.

Clause 8. The dual-input amplifier of clause 7, wherein the envelope signal is a differential envelope signal and the first vector-sum phase-shifter comprises:

a first plurality of circuits, each circuit in the first plurality of circuits being configured to respond to an assertion of a corresponding digital bit from a first digital word to mix the differential in-phase signal with the differential envelope signal;

a second plurality of circuits, each circuit in the second plurality of circuits being configured to respond to an assertion of a corresponding digital bit from a second digital word to mix the differential in-phase signal with the differential envelope signal;

a third plurality of circuits, each circuit in the third plurality of circuits being configured to respond to an assertion of a corresponding digital bit from a third digital word to mix the differential quadrature-phase signal with the differential envelope signal; and a fourth plurality of circuits, each circuit in the fourth plurality of circuits being configured to respond to an assertion of a corresponding digital bit from a fourth digital word to mix the differential quadrature-phase signal with the differential envelope signal.

Clause 9. The dual-input amplifier of clause 8, further comprising:

a combining network configured to couple the first plurality of circuits, the second plurality of circuits, the third plurality of circuits, and the fourth plurality of circuits to the first pair of output terminals and to the second pair of output terminals.

Clause 10. The dual-input amplifier of clause 8, wherein the second vector-sum phase-shifter also comprises four pluralities of mixer-like circuits.

Clause 11. The dual-input amplifier of any of clauses 1-10, wherein the phase-reconfigurable circuit is incorporated into a Doherty amplifier comprising:

a first differential-to-single-ended converter coupled to the first pair of output terminals and configured to convert the first differential output signal into a first single-ended output signal;

a first driver amplifier configured to amplify the first single-ended RF output signal to form a first driver output signal; and a carrier amplifier configured to amplify the first driver output signal.

Clause 12. The dual-input amplifier of clause 11, wherein the Doherty amplifier further comprises:

a second differential-to-single-ended converter coupled to the second pair of output terminals and configured to convert the second differential output signal into a second single-ended output signal;

a second driver amplifier configured to amplify the second single-ended output signal to form a second driver output signal; and a peaking amplifier configured to amplify the second driver output signal.

Clause 13. The dual-input amplifier of clause 12, further comprising:

a combiner configured to combine a carrier output signal from the carrier amplifier with a peaking output signal from the peaking amplifier to form a combined output signal.

Clause 14. The dual-input amplifier of any of clauses 1-13, further comprising:

a delay and impedance matching circuit configured to delay the RF input signal into a delayed matched signal; and a pre-amplifier configured to pre-amplify the delayed matched signal to form the version of the RF input signal.

Clause 15. The dual-input amplifier of any of clause 7, wherein the envelope detector further comprises a transconductance amplifier configured to form the differential envelope signal responsive to a difference between the envelope of the RF input signal and a reference voltage signal.

Clause 16. A dual-input amplifier method, comprising:

converting an RF input signal into a differential in-phase signal and a differential quadrature-phase signal;

processing the differential in-phase signal and the differential quadrature-phase signal to form a first differential output signal and a second differential output signal, wherein the first differential output signal has a phase difference with respect to the second differential output signal; and adjusting the phase difference responsive to a power of the RF input signal.

Clause 17. The dual-input amplifier method of clause 16, further comprising:

pre-amplifying the first differential output signal to form a pre-amplified first differential output signal; and pre-amplifying the second differential output signal to form a pre-amplified second differential output signal.

Clause 18. The dual-input amplifier method of claim 16, further comprising:

converting the first differential output signal into a first single-ended output signal;

pre-amplifying the first single-ended output signal to form a pre-amplified first output signal;

converting the second differential output signal into a second single-ended output signal; and pre-amplifying the second single-ended output signal to form a pre-amplified second output signal.

Clause 19. The dual-input amplifier method of clause 18, further comprising:

amplifying the pre-amplified first output signal in a first series of a first driver amplifier and a carrier amplifier to form an amplified first output signal; and amplifying the pre-amplified second output signal in a second series of a second driver amplifier and a peaking amplifier to form an amplified second output signal;

combining the amplified first output signal and the amplified second output signal to form a combined RF output signal; and transmitting the combined RF output signal over an at least one antenna.

Clause 20. A dual-input amplifier, comprising:

a pair of vector-sum phase shifters configured to dynamically modulate a phase difference between a first differential output signal and a second differential output signal responsive to a power of an input RF signal;

a first differential-to-single-ended converter configured to convert the first differential output signal into a first single-ended output signal;

a first driver amplifier configured to amplify the first single-ended output signal to form a first driver output signal; and a first power amplifier configured to amplify the first driver output signal to form a first power amplifier output signal.

Clause 21. The dual-input amplifier of clause 20, further comprising:

a second differential-to-single-ended converter configured to convert the second differential output signal into a second single-ended output signal;

a second driver amplifier configured to amplify the second single-ended output signal to form a second driver output signal; and a second power amplifier configured to amplify the second driver output signal to form a second power amplifier output signal.

Clause 22. The dual-input amplifier of clause 21, further comprising:

a combiner configured to combine the first power amplifier output signal with the second power amplifier output signal to form a combined RF output signal.

Clause 23. The dual-input amplifier of clause 22, wherein the dual-input amplifier is integrated into a transmitter including at least one antenna configured to transmit the combined RF output signal.

Clause 24. The dual-input amplifier of clause 22, wherein the dual-input amplifier comprises a Doherty amplifier in which the first power amplifier is a carrier amplifier and in which the second power amplifier is a peaking amplifier.

Clause 25. A transmitter, comprising:

a delay and impedance matching circuit configured to delay an RF input signal into a delayed matched signal;

a pre-amplifier configured to amplify the delayed matched signal to form an amplified input signal;

a single-ended-to-differential conversion circuit configured to convert the amplified input signal into a differential input signal;

a polyphase filter configured to convert the differential input signal into a differential in-phase signal and a differential quadrature-phase signal;

a first vector-sum phase-shifter and a second vector-sum phase shifter both configured to process the differential in-phase signal and the differential quadrature-phase signal to form a first differential output signal and a second differential output signal and to dynamically modulate a phase difference between the first differential output signal and the second differential output signal responsive to a power of the RF input signal;

a first differential-to-single-ended conversion circuit configured to convert the first differential output signal to form a first single-ended output signal;

a second differential-to-single-ended conversion circuit configured to convert the second differential output signal to form a second single-ended output signal;

one or more first amplifiers configured to amplify the first single-ended output signal to form a first amplified RF signal;

one or more second amplifiers configured to amplify the second single-ended output signal to form a second amplified RF signal; and a combiner configured to combine the first amplified RF signal and the second amplified RF signal to form a combined RF output signal.

Clause 26. The transmitter of clause 25, wherein the one or more first amplifiers comprises a first series of a first driver amplifier and a first power amplifier, and wherein the one or more second amplifiers comprises a second series of a second driver amplifier and a second power amplifier.

Clause 27. The transmitter of clause 25, wherein the polyphase filter is a two-stage polyphase filter.

Clause 28. The transmitter of clause 27, wherein the two-stage polyphase filter is a two-stage transconductance-capacitor (gm-C) polyphase filter.

Clause 29. The transmitter of clause 27, wherein the two-stage polyphase filter is a two-stage resistor-capacitor (RC) polyphase filter.

Clause 30. The transmitter of any of clauses 25-30, wherein the one or more first amplifiers includes a carrier amplifier of a Doherty amplifier, and wherein the one or more second amplifiers includes a peaking amplifier of the Doherty amplifier.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A dual amplifier input circuit, comprising:

a delay and impedance matching circuit configured to delay a radio frequency (RF) input signal into a delayed matched signal;

a pre-amplifier configured to pre-amplify the delayed matched signal to form a version of the RF input signal;

an envelope detector configured to process an envelope of the RF input signal to form an envelope signal;

a single-ended-to-differential converter configured to convert the version of the RF input signal into a differential RF input signal;

an I/Q generator circuit configured to convert the differential RF input signal into a differential in-phase signal and into a differential quadrature-phase signal;

a first vector-sum phase-shifter;

a second vector-sum phase-shifter;

a first pair of output terminals; and a second pair of output terminals, wherein the first vector-sum phase-shifter and the second vector-sum phase-shifter are configured to process the differential in-phase signal and the differential quadrature-phase signal to form a first differential output signal at the first pair of output terminals and to form a second differential output signal at the second pair of output terminals and to adjust a phase difference between the first differential output signal and the second differential output signal responsive to the envelope signal.

2. The dual amplifier input circuit of claim 1, wherein the I/Q generator circuit comprises a polyphase filter.

3. The dual amplifier input circuit of claim 2, wherein the polyphase filter comprises a transconductance-capacitor (gm-C) polyphase filter.

4. The dual amplifier input circuit of claim 2, wherein the polyphase filter comprises a resistor-capacitor (RC) polyphase filter.

5. The dual amplifier input circuit of claim 2, wherein the polyphase filter comprises a two-stage RC polyphase filter.

6. The dual amplifier input circuit of claim 2, wherein the polyphase filter comprises a two-stage gm-C polyphase filter.

7. The dual amplifier input circuit of claim 1, wherein the envelope signal is a differential envelope signal, and the dual amplifier input circuit further comprises:
- a switch configured to couple the differential envelope signal from the envelope detector to the first vector-sum phase-shifter and the second vector-sum phase-shifter.

8. The dual amplifier input circuit of claim 7, wherein the envelope signal is a differential envelope signal and the first vector-sum phase-shifter comprises:
- a first plurality of circuits, each circuit in the first plurality of circuits being configured to respond to an assertion of a corresponding digital bit from a first digital word to mix the differential in-phase signal with the differential envelope signal;
- a second plurality of circuits, each circuit in the second plurality of circuits being configured to respond to an assertion of a corresponding digital bit from a second digital word to mix the differential in-phase signal with the differential envelope signal;
- a third plurality of circuits, each circuit in the third plurality of circuits being configured to respond to an assertion of a corresponding digital bit from a third digital word to mix the differential quadrature-phase signal with the differential envelope signal; and
- a fourth plurality of circuits, each circuit in the fourth plurality of circuits being configured to respond to an assertion of a corresponding digital bit from a fourth digital word to mix the differential quadrature-phase signal with the differential envelope signal.

9. The dual amplifier input circuit of claim 8, further comprising:
- a combining network configured to couple the first plurality of circuits, the second plurality of circuits, the third plurality of circuits, and the fourth plurality of circuits to the first pair of output terminals and to the second pair of output terminals.

10. The dual amplifier input circuit of claim 8, wherein the second vector-sum phase-shifter also comprises four pluralities of mixer-like circuits.

11. The dual amplifier input circuit of claim 1, further comprising a Doherty amplifier comprising:
- a first differential-to-single-ended converter coupled to the first pair of output terminals and configured to convert the first differential output signal into a first single-ended output signal;
- a first driver amplifier configured to amplify the first single-ended output signal to form a first driver output signal;
- a carrier amplifier configured to amplify the first driver output signal;
- a second differential-to-single-ended converter coupled to the second pair of output terminals and configured to convert the second differential output signal into a second single-ended output signal;
- a second driver amplifier configured to amplify the second single-ended output signal to form a second driver output signal; and
- a peaking amplifier configured to amplify the second driver output signal.

12. The dual amplifier input circuit of claim 11, further comprising:
- a combiner configured to combine a carrier output signal from the carrier amplifier with a peaking output signal from the peaking amplifier to form a combined output signal.

13. The dual amplifier input circuit of claim 7, wherein the envelope detector further comprises a transconductance amplifier configured to form the differential envelope signal responsive to a difference between the envelope of the RF input signal and a reference voltage signal.

14. A dual amplifier, comprising:
- a delay and impedance matching circuit configured to delay a radio frequency (RF) input signal into a delayed matched signal;
- a pre-amplifier configured to amplify the delayed matched signal to form an amplified input signal;
- a single-ended-to-differential converter configured to convert the delayed matched signal into a differential input signal;
- an I/Q generator circuit configured to convert the differential input signal into a differential in-phase signal and into a differential quadrature-phase signal;
- a first vector-sum phase-shifter and a second vector-sum phase-shifter configured to dynamically modulate a phase difference between a first differential output signal and a second differential output signal responsive to a power of the RF input signal;
- a first differential-to-single-ended converter configured to convert the first differential output signal into a first single-ended output signal;
- a second differential-to-single-ended converter configured to convert the second differential output signal into a second single-ended output signal;
- a first amplifier configured to amplify the first single-ended output signal to form a first amplifier output signal; and
- a second amplifier configured to amplify the second single-ended output signal to form a second amplifier output signal.

15. The dual amplifier of claim 14, further comprising:
- a combiner configured to combine the first amplifier output signal with the second amplifier output signal to form a combined RF output signal.

16. The dual amplifier of claim 15, wherein the dual amplifier is integrated into a transmitter including at least one antenna configured to transmit the combined RF output signal.

17. The dual amplifier of claim 15, wherein the dual amplifier comprises a Doherty amplifier in which the first amplifier is a carrier amplifier and in which the second amplifier is a peaking amplifier.

18. An amplifier, comprising:
- a delay and impedance matching circuit configured to delay a radio frequency (RF) input signal into a delayed matched signal;

a pre-amplifier configured to amplify the delayed matched signal to form an amplified input signal;

a single-ended-to-differential conversion circuit configured to convert the amplified input signal into a differential input signal;

a polyphase filter configured to convert the differential input signal into a differential in-phase signal and a differential quadrature-phase signal;

a first vector-sum phase-shifter and a second vector-sum phase-shifter both configured to process the differential in-phase signal and the differential quadrature-phase signal to form a first differential output signal and a second differential output signal and to dynamically modulate a phase difference between the first differential output signal and the second differential output signal responsive to a power of the RF input signal;

a first differential-to-single-ended conversion circuit configured to convert the first differential output signal to form a first single-ended output signal;

a second differential-to-single-ended conversion circuit configured to convert the second differential output signal to form a second single-ended output signal;

one or more first amplifiers configured to amplify the first single-ended output signal to form a first amplified RF signal;

one or more second amplifiers configured to amplify the second single-ended output signal to form a second amplified RF signal; and a combiner configured to combine the first amplified RF signal and the second amplified RF signal to form a combined RF output signal.

19. The amplifier of claim 18, wherein the one or more first amplifiers comprises a first series of a first driver amplifier and a first power amplifier, and wherein the one or more second amplifiers comprises a second series of a second driver amplifier and a second power amplifier.

20. The amplifier of claim 18, wherein the polyphase filter comprises a two-stage polyphase filter.

21. The amplifier of claim 18, wherein the polyphase filter is a two-stage transconductance-capacitor (gm-C) polyphase filter.

22. The amplifier of claim 18, wherein the polyphase filter is a two-stage resistor-capacitor (RC) polyphase filter.

23. The amplifier of claim 18, wherein the one or more first amplifiers includes a carrier amplifier of a Doherty amplifier, and wherein the one or more second amplifiers includes a peaking amplifier of the Doherty amplifier.

24. The dual amplifier of claim 14, further comprising:

an envelope detector configured to process an envelope of the RF input signal to form an envelope signal.

25. The dual amplifier of claim 24, wherein the envelope signal is a differential envelope signal, and wherein the dual amplifier further comprises:

a switch configured to couple the differential envelope signal from the envelope detector to the first vector-sum phase-shifter and the second vector-sum phase-shifter.

26. The dual amplifier of claim 24, wherein the envelope signal is a differential envelope signal and the first vector-sum phase-shifter comprises:

a first plurality of circuits, each circuit in the first plurality of circuits being configured to respond to an assertion of a corresponding digital bit from a first digital word to mix the differential in-phase signal with the differential envelope signal;

a second plurality of circuits, each circuit in the second plurality of circuits being configured to respond to an assertion of a corresponding digital bit from a second digital word to mix the differential in-phase signal with the differential envelope signal;

a third plurality of circuits, each circuit in the third plurality of circuits being configured to respond to an assertion of a corresponding digital bit from a third digital word to mix the differential quadrature-phase signal with the differential envelope signal; and a fourth plurality of circuits, each circuit in the fourth plurality of circuits being configured to respond to an assertion of a corresponding digital bit from a fourth digital word to mix the differential quadrature-phase signal with the differential envelope signal.

27. The amplifier of claim 18, further comprising:

an envelope detector configured to process an envelope of the RF input signal to form an envelope signal.

28. The amplifier of claim 27, wherein the envelope signal is a differential envelope signal, and the amplifier further comprises:

a switch configured to couple the differential envelope signal from the envelope detector to the first vector-sum phase-shifter and the second vector-sum phase-shifter.

29. The amplifier of claim 27, wherein the envelope signal is a differential envelope signal and the first vector-sum phase-shifter comprises:

a first plurality of circuits, each circuit in the first plurality of circuits being configured to respond to an assertion of a corresponding digital bit from a first digital word to mix the differential in-phase signal with the differential envelope signal;

a second plurality of circuits, each circuit in the second plurality of circuits being configured to respond to an assertion of a corresponding digital bit from a second digital word to mix the differential in-phase signal with the differential envelope signal;

a third plurality of circuits, each circuit in the third plurality of circuits being configured to respond to an assertion of a corresponding digital bit from a third digital word to mix the differential quadrature-phase signal with the differential envelope signal; and a fourth plurality of circuits, each circuit in the fourth plurality of circuits being configured to respond to an assertion of a corresponding digital bit from a fourth digital word to mix the differential quadrature-phase signal with the differential envelope signal.

* * * * *